United States Patent [19]

van Roermund

[11] Patent Number: 4,616,192

[45] Date of Patent: Oct. 7, 1986

[54] PHASE-LOCKED LOOP WITH SWITCHABLE PHASE DETECTOR

[75] Inventor: Arthur H. M. van Roermund, Eindhoven, Netherlands

[73] Assignee: U.S. Philips Corporation, New York, N.Y.

[21] Appl. No.: 722,891

[22] Filed: Apr. 12, 1985

[30] Foreign Application Priority Data

Apr. 19, 1984 [NL] Netherlands .................... 8401277

[51] Int. Cl.$^4$ ............................................. H03L 7/16
[52] U.S. Cl. ........................................ 331/14; 331/17; 331/25
[58] Field of Search .................. 331/14, 17, 25, 27

[56] References Cited

U.S. PATENT DOCUMENTS 4,219,784  8/1980  Detering ........................... 331/27

Primary Examiner—Eugene R. LaRoche
Assistant Examiner—James C. Lee
Attorney, Agent, or Firm—Thomas A. Briody; William J. Streeter; Marianne R. Rich

[57] ABSTRACT

A phase-locked loop has a phase detector and a clock pulse oscillator. The phase detector multiplies a received reference signal by a comparison signal. It is constituted by a plurality of signal channels 207 each receiving the reference signal and having a cascade arrangement of a switching circuit 208 and a weighting network 209. The switching circuit is controlled by one or more sequences of main control pulses supplied by a pulse distributor circuit receiving clock pulses. Each signal channel has a constant weighting factor. For the $k^{th}$ signal channel the weighting factor is equal to the signal sample $n(t_o+kT_s)$ of a fundamental signal $n(t)$ which has a fundamental frequency $f_o$. $T_s$ is the reciprocal of the clock pulse frequency $f_s$. For each sequence of main control pulses controlling the switching circuit in the $k^{th}$ signal channel, this signal channel produces a main signal $z(k, t)$. The main signals supplied by all the signal channels are added together. To allow locking of the loop on frequencies which are an integral multiple $p$ of the fundamental frequency, the clock pulse oscillator has a frequency $f_s$ which is an integral multiple $N$ of the fundamental frequency. In addition, the pulse distributor circuit has an input for setting the parameter $p$ and at least $N$ distributor outputs to which the several clock pulses are applied. More specifically, the clock pulse having number $n$ is applied to the distributor output having number $np$ modulo $N$. The sequence of pulses thus occurring at these distributor outputs constitutes the sequence of main control pulses.

1 Claim, 8 Drawing Figures

PHASE-LOCKED LOOP WITH SWITCHABLE PHASE DETECTOR

BACKGROUND OF THE INVENTION (1) Field of the Invention

In its generality, the invention relates to phase-locked loops and more specifically to a phase-locked loop whose phase detector is in the form of a multiplying circuit.

(2) Description of the Prior Art

As is generally known, a phase-locked loop is a circuit comprising a voltage-controlled oscillator (VCO) which is controlled by a control voltage and produces an output signal whose frequency is determined by this control voltage. In the foregoing, the output signal of the voltage-controlled oscillator will be denoted the VCO-signal for the sake of brevity, and its frequency the VCO-frequency. The control voltage is generated by a cascade-arrangement of a phase detector and a low-pass filter. A reference signal having a predetermined reference frequency and a comparison signal having a predetermined comparison frequency are applied to this phase detector.

The reference signal may be a signal produced by a reference source, for example a crystal oscillator. It may alternatively be a pilot signal present in a received signal. The comparison signal is derived from the VCO-signal. If the loop is locked, then the frequency of the comparison signal is equal to the reference frequency and there is no phase difference, or only a very small one between the comparison signal and the reference signal. Any change in the frequency or the phase of the comparison signal relative to the reference signal causes the control voltage to change, as a result of which the frequency of the VCO-signal changes such that the frequency difference and also any phase difference between the reference and comparison signals is eliminated.

In the generally known analogue phase-locked loop, a voltage-controlled oscillator is used which produces a, usually sinusoidal, analogue VCO-signal. The reference signal is then also an analogue signal. In this analogue phase-locked loop it can be determined at any instant whether there is a phase difference between the comparison signal and the reference signal. If so, the VCO-frequency is immediately corrected.

In a digital phase-locked loop the comparison signal is a binary pulse-shaped signal and this usually also holds for the reference signal. This comparison signal is derived with the aid of a digital frequency divider circuit from the voltage-controlled oscillator which oscillates at a frequency which is significantly higher than the reference frequency. The stability of the voltage-controlled oscillator is considerably poorer in this digital phase-locked loop than in the analogue phase-locked loop. This is caused by the frequency divider circuit. If, for example, this frequency divider circuit has a dividing factor R, then a correction of the VCO-frequency is effected not more than twice per R periods of the VCO-signal, as the comparison signal only changes its value twice in each group of R VCO-signal periods. The oscillator can in principle oscillate at any frequency during two consecutive corrections.

Another embodiment of a phase-locked loop is extensively described in the Reference (see paragraph C). More specifically, in the phase-locked loop described therein the phase detector is in the form of a multiplier circuit having a multiplier to which an analogue reference signal is applied and also a sampled version of an analogue comparison signal. The frequency of this analogue comparison signal is equal to the reference frequency and sampling has been effected under the control of clock pulses occurring at a rate which is a multiple N of the comparison frequency. These clock pulses are produced by the voltage-controlled oscillator which is in the form of a clock pulse oscillator.

In a practical embodiment, the multiplier circuit comprises a pulse distributor circuit receiving the clock pulses and distributing them cyclically over not more than N distributor outputs. More specifically, the $N^{th}$ clock pulse is applied to the distributor output having number n modulo N, or, which is the same, the distributor output having number k receives the clock pulses having the numbers $k+iN$, where $i=\ldots -2, -1, 0, 1, 2, 3, \ldots$. Thus, a sequence of main control pulses is produced at each of these distributor outputs. In addition, a plurality of signal channels are present which each receive the reference signal and each comprise a cascade arrangement of a switching circuit and a weighting network having a constant weighting factor. The value of the weighting factor of the weighting network in the $k^{th}$ signal channel is related to the value of the comparison signal at the instant at which the clock pulses having number $k+iN$ occur; $i=\ldots -2, -1, 0, 1, 2, 3, \ldots$. In other words, the weighting factor is proportional to a given sample of the comparison signal. Each switching circuit is controlled by one or more of said sequences of main control pulses. The signal channel produces a main signal for each sequence of main control pulses applied to the relevant switching circuit. In an adder arrangement all the main signals are added together which produces the desired product signal.

In this prior art multiplying circuit the desired dividing factor of the phase-locked loop is also incorporated; it is namely proportional to the number of sequences of main control pulses produced by the pulse distributor circuit.

As in this embodiment of the phase-controlled loop a sample of the comparison signal is applied to the multiplier for each clock pulse, it is also possible to correct the frequency of the clock pulse oscillator at any clock instant, so that the clock pulse oscillator now has a significantly higher stability than the oscillator in the digital phase-locked loop. However, because of the absence of an adjustable frequency divider circuit it is less flexible than this digital phase-locked loop.

OBJECT AND SUMMARY OF THE INVENTION

The invention has for its object to provide a phase-locked loop in which the phase detector is constituted by a multiplying circuit which in the above-described manner comprises a plurality of parallel-arranged signal channels and can be locked to any frequency of a discrete sequence of frequencies which are all an integral multiple p of a given fundamental frequency $f_o$.

According to the invention, the clock pulse oscillator produces the clock pulses at a rate $f_s$ which is equal to an integral multiple N of a predetermined fundamental frequency $f_o$ of a fundamental signal, and, in addition, the pulse distribution circuit comprises means for adjusting the parameter p in response to which it applies a clock pulse having number N, applied to it, to the pulse distributor output having number np modulo N, whilst in addition the weighting factor of the weighting network in the $k^{th}$ signal channel is related to the value the fundamental signal has at the instant $t_o+kT_s$, where $t_o$ represents a constant and $T_s$ is the reciprocal value of $f_s$.

REFERENCE

Vermenigvuldigschakeling voor stereo-decoders; Netherlands patent application No. 831014. This patent application is equivalent to U.S. patent application Ser. No. 416,737, filed Sept. 10, 1982 (U.S. Pat. No. 4,517,655).

SHORT DESCRIPTION OF THE FIGURES

DESCRIPTION OF THE EMBODIMENTS

Figure 1:
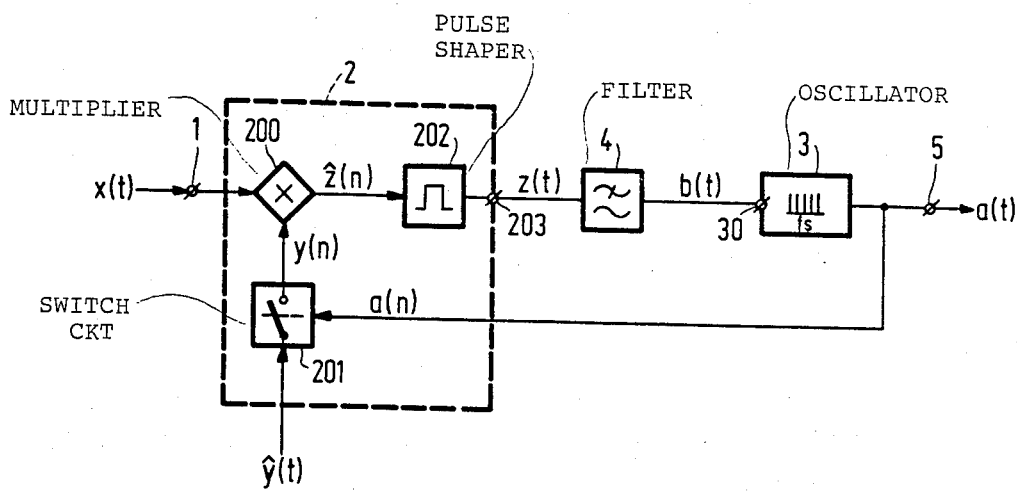
FIG. 1 shows schematically the general structure of the phase-locked loop.

FIG. 1 shows schematically the structure of a phase-locked loop. It has a reference signal input 1 which receives a reference signal x(t), which is applied to a phase-detector circuit 2 which is in the form of a multiplying circuit and is constructed in the manner extensively described in the Reference (see paragraph C). As is shown schematically in the FIGURE, it comprises a multiplier 200 to which the reference signal x(t) and also comparison signal samples y(n) of an analogue periodic comparison signal ŷ(t) are applied. More specifically, to this end the comparison signal ŷ(t) is sampled in a sampling arrangement 201 at sampling instants which are determined by clock pulses a(n); n=... −2, −1, 0, 1, 2, 3, .... The multiplier 200 produces a product signal ẑ(n) formed by a sequence of amplitude-modulated pulses, whose pulse widths as are also the pulse widths of the reference signal samples y(n) is very small. Consequently, this product signal z(n) has an energy content which is insufficient for practical purposes. So as to bring this energy content to an adequate level, either y(n) to ẑ(n) can be converted with the aid of a pulse-reshaping circuit into a signal which is formed by pulses of a finite duration. In the embodiment which is schematically illustrated in FIG. 1, this pulse-reshaping circuit is denoted by reference numeral 202 and is connected to the output of the amplifier 200, so that it converts infinitely small pulses ẑ(n) into a multiplier circuit output signal z(t) which occurs at the multiple circuit output 203 and is formed by a sequence of amplitude-modulated pulses having finite widths.

The clock pulses a(n) used for sampling the analogue comparison signal ŷ(t) are produced by a clock pulse oscillator 3, which has a control input 30 for receiving a control signal b(t). This control signal is produced by a narrow-band low-pass filter 4, which couples the multiplier circuit output 203 to the control input 30.

The clock pulse oscillator 3 supplies the clock pulse a(n) at a rate $f_s$ (denoted the clock pulse frequency hereinafter) which is an integral multiple N of a predetermined fundamental frequency $f_o$ of a fundamental signal ñ(t). These clock pulses are not only applied to the sampling arrangement but also to the output 5 of the phase-locked loop.

Like the clock pulse frequency also the repetition rate of the comparison signal is related to said fundamental frequency. This repetition rate must namely be an integral multiple f of the fundamental frequency $f_o$.

Figure 2:
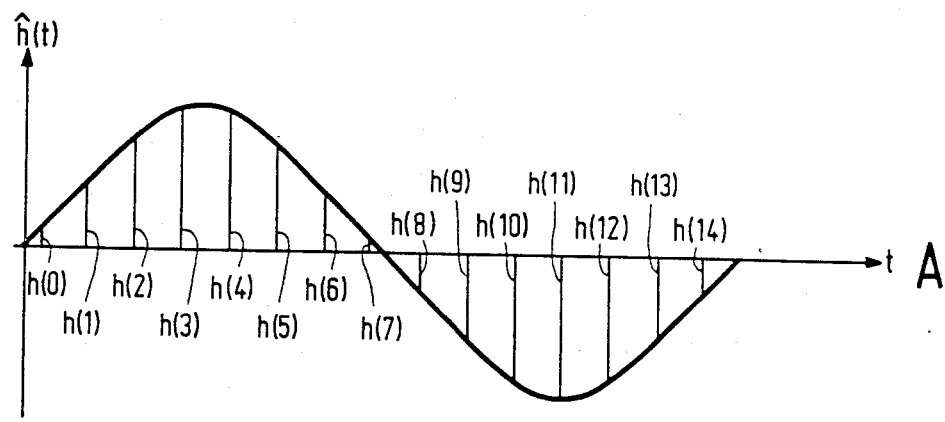
FIG. 2 shows some time diagrams to explain the phase-locked loop shown in FIG. 1.
Figure 2:
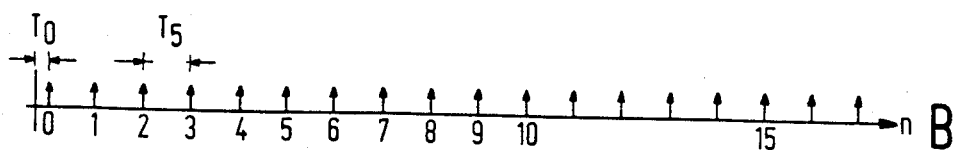

Let it be assumed that the comparison signal is equal to the fundamental signal ñ(t), which is shown at A in FIG. 2 and has a sinusoidal variation. Let N=15 and the clock pulses a(n) occur at instants $t_o+nT_s$ shown at B in FIG. 2, where $T_s$ is the reciprocal value of the clock pulse frequency and $t_o$ represents a constant. The sampling arrangement 201 then also produces the sequence of fundamental signal samples h(0), h(1), h(2), ... h(q), ... h(N−2), h(N−1), where it holds for the general term h(q) that h(q)=ñ($t_o+qT_s$); q=0, 1, 2, 3, ... N−1, which sequence is also shown at A in FIG. 2 and is repeated at the rate $f_o$.

Figure 3:
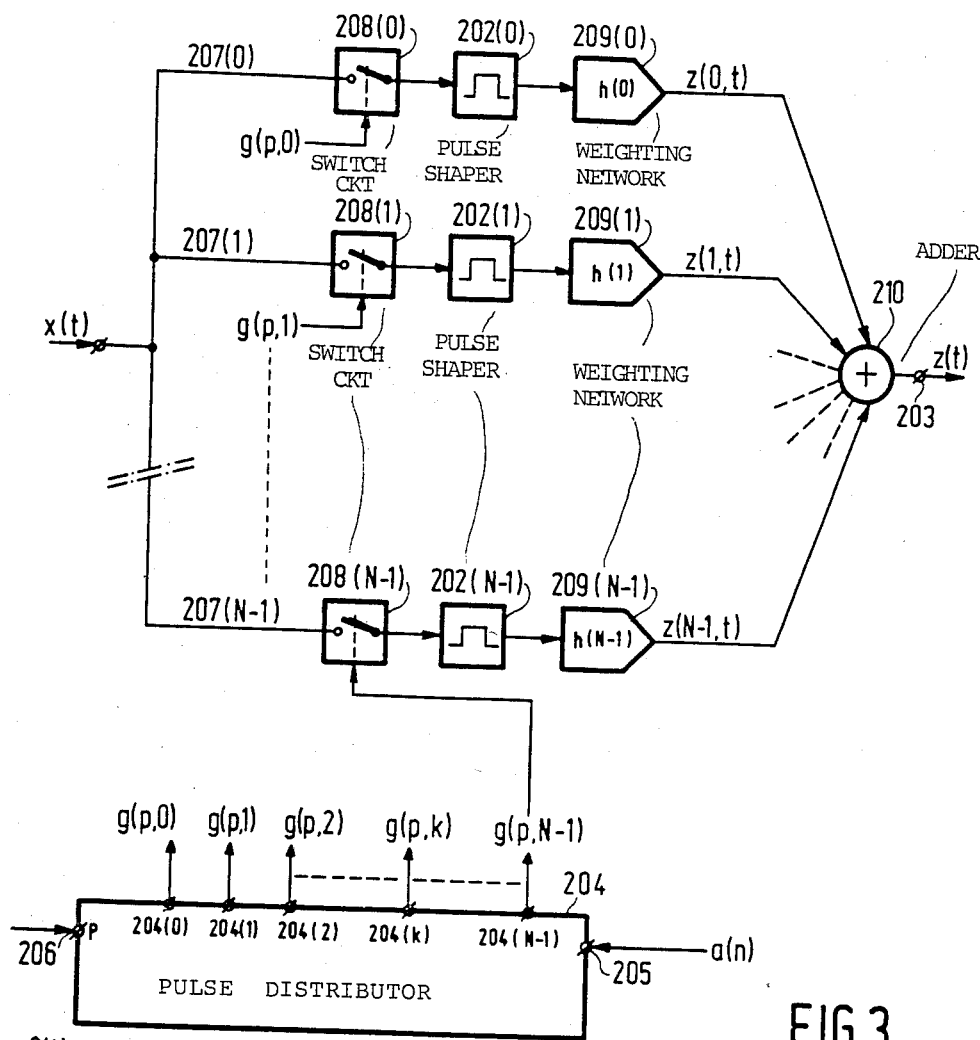
FIG. 3 shows an embodiment of the multiplying circuit for use as a phase detector circuit in the phase-locked loop shown in FIG. 1.

An embodiment, suitable for practical usage of the multiplier circuit is shown in FIG. 3. It comprises a pulse distribution circuit 204 to which the clock pulses a(n) produced by the clock pulse oscillator 3 (FIG. 1) are applied via an input 205 and a control input 206 for setting a parameter p. The pulse distribution circuit has N distributing outputs 204(0), ... 204(k), ... 204(N−1). A clock pulse a(n) is applied by this distribution circuit to the distributing output 204(np modulo N), so that generally a sequence of main control pulses g(p, k) occurs at a distributor output 204(k).

As is extensively described in Reference 1 this multiplier circuit further comprises N signal channels 207(k) which each receive the reference signal x(t). Each of these signal channels comprises a cascade arrangement formed by a switching circuit 208(k), a pulse-reshaping circuit 202(k) and a weighting network 209(k). The switching circuit 208(k) is in the form of a single-throw switch and is controlled by the $k^{th}$ sequence of main control pulses g(p, k). The weighting network 209(k) has a constant weighting factor whose value is related to the value of the fundamental signal at the instant $t_o+kT_s$. More specifically, in the embodiment shown this weighting factor is therefore equal to h(k)=ñ($t_o+kT_s$). These weighting factors are shown at A in FIG. 2. Now each signal channel produces one main signal z(k, t) and all these main signals are added together in the adder arrangement 210, whose output constitutes the output 203 of the multiplying circuit at which the multiplying circuit output z(t) occurs.

The multiplying circuit now operates as follows. If p=1, the sampling arrangements receive a main control pulse in the sequence 208(0), 208(1), 208(2), 208(3), 208(4), 208(5), 208(6), 208(7), ... 208(14), respectively. As a result thereof the samples which are taken one after the other of the reference signal are multiplied by the respective weighting factors h(0), h(1), h(2), h(3), h(4), ... h(14). This implies that the reference signal x(t) is multiplied by the sinusoidal fundamental signal ñ(t) such as it is shown at A in FIG. 2 and whose frequency is equal to the fundamental frequency $f_o$.

Figure 4:
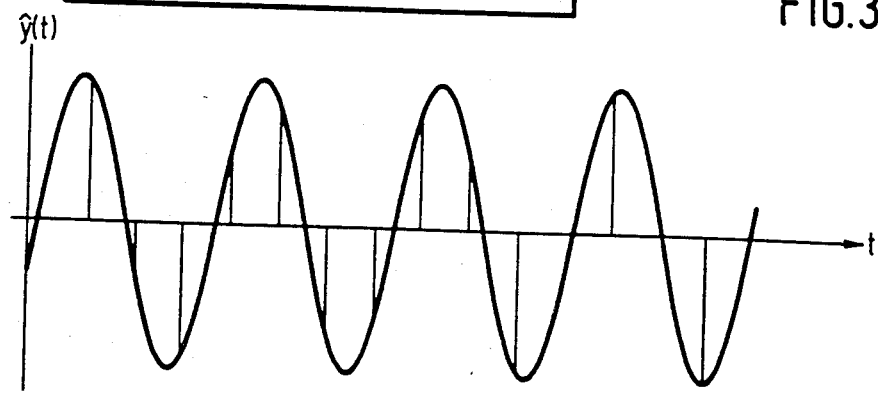
FIG. 4 shows a time diagram to explain the operation of the multiplying circuit shown in FIG. 3.

If p=4, the sampling arrangements receive a main control pulse in the sequence 208(0), 208(4), 208(8), 208(12), 208(1), 208(5), 208(9), 208(13), 208(2), 208(6), 208(10), 208(14), 208(3), 208(7), 208(11), respectively. As a result thereof, the samples taken one after the other of the reference signal are multiplied by the respective weighting factors h(0), h(4), h(8), h(12), h(1), h(5), h(9), h(13), h(2), h(6), h(10), h(14), h(3), h(7), h(11). This means that the reference signal x(t) is multiplied by a sinusoidal comparison signal whose frequency is four times the fundamental frequency $f_o$. For the sake of completeness this is shown in greater detail in FIG. 4.

Figure 5:
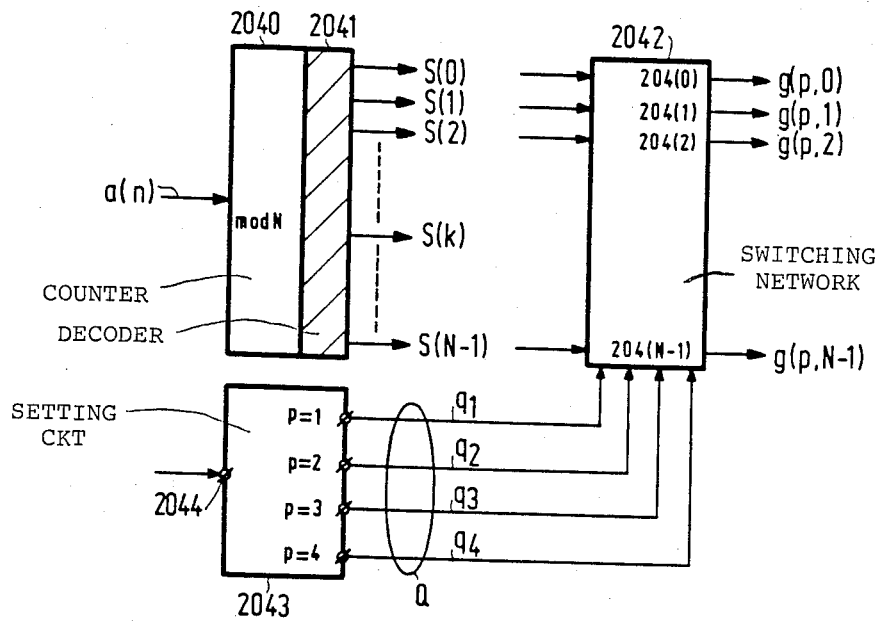
FIG. 5 shows an embodiment of a pulse distribution circuit for use in the multiplying circuit of FIG. 3.

FIG. 5 shows schematically an embodiment of the pulse distribution circuit 204. It comprises a modulo N counter 2040 to which the clock pulses a(n) are applied and to which a decoding network 2041 is connected. This decoding network produced N sequences of sub-pulses S(k). If more specifically N=15, then a sub-pulse S(0) occurs each time the counting position is 0000. At each counting position 0001 a sub-pulse S(1) is produced, whilst a sub-pulse S(2) occurs at each counting position 0010: etc. These sub-pulses S(k) are applied to a switching network 2042 which may be formed by gate circuits. It further has N outputs which form said distribution outputs 204(0), . . . 204(N−1) and at which the main control pulses g(p, 0), . . . g(p, N−1) occur. It is further controlled by a code word Q consisting of 4 bits and being related to the value of the parameter p. This code word is produced by a setting circuit 2043 which has an input 2044 via which this parameter p can be adjusted. More specifically, this parameter p is applied as a 2-bit digital number to this input 2044 and this setting circuit 2043 is in the form of a decoding network having four outputs $q_1$, $q_2$, $q_3$ and $q_4$. This circuit supplies a logic "1" from its input $q_1$ and a logic "0" from the further outputs when p=1. If p=2 then it only supplies a logic "1" from the output $q_2$. It supplies a logic "1" only from the output $q_3$ when p=3, whilst it supplies a logic "1" only from the output $q_4$ when p=4. In response to this code word Q the sub-pulses S(k) are applied to the output 204(kp modulo N) of this switching network 2042.

The switching circuit 208(k) as shown in FIG. 3 functions in essence as a sampling arrangement and the subsequent pulse-reshaping circuit 202(k) functions as a hold circuit. The function of the cascade arrangement of these two elements can therefore in practice be realized with the aid of a sample-and-hold circuit.

Figure 6:
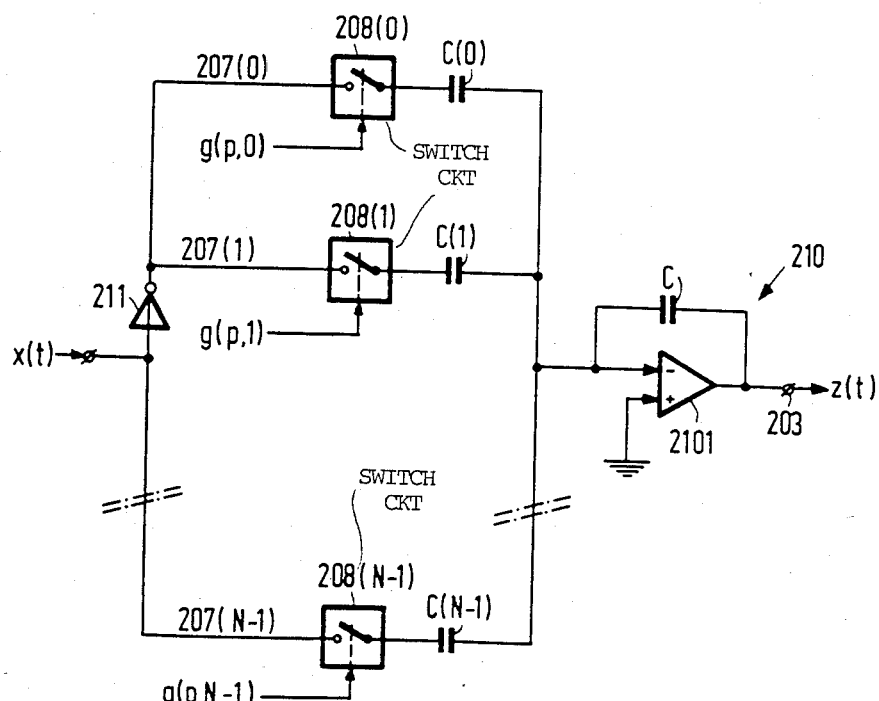
FIG. 6, FIG. 7 and FIG. 8 show some alternative embodiments of the multiplying circuit shown in FIG. 3.

An embodiment of the multiplying circuit 2, formed with the aid of sample-and-hold circuits and which is particularly advantageous for implementation as an IC (Integrated Circuit) is shown in FIG. 6 for the sake of completeness. This embodiment results directly from the embodiment shown in FIG. 3. For that purpose, in FIG. 3 the pulse-reshaping circuit 202(k) must in each signal channel 207(k) be constituted by a capacitor having a capacitance C(k). The adder arrangement 210 must be constructed in the manner shown in the FIGURE with the aid of an operational amplifier 2101 and a capacitor having capacitance C. This multiplying circuit operates as follows. When the sampling arrangement 208(k) is briefly short-circuited by the occurrence of a main control pulse g(p, k), a charge having a value ΔQ(k) is applied to this capacitor C(k) causing the voltage across this capacitor to be increased by an amount V(k) to a voltage V(k) which is equal to the instantaneous value of x(t). It now holds that:

$$\Delta Q(k) = C(k)\Delta V(k)$$

Using the operational amplifier 2101 changes the voltage at the output 203 by an amount ΔV, for which it holds that:

$$\Delta V = -\frac{C(k)}{C} \Delta V(k)$$

In this expression the quantity −C(k)/C represents a multiplying factor. This factor must now have an absolute value which is equal to the absolute value |h(k)| of h(k), so that it holds that:

$$\frac{C(k)}{C} = |h(k)|$$

$$C(k) = |h(k)| \cdot C$$

So in each of the signal channels the associated capacitor C(k) does not only function as a pulse-reshaping circuit, but also as a weighting network having a weighting factor +C(k).

As will be obvious from the foregoing (more specifically from FIG. 2), the polarity of the weighting factors in the several signal channels is different. So as to realize both positive and negative weighting factors in the embodiment shown in FIG. 6, the polarity of the reference signal x(t) is first inverted before the signal is applied to those signal channels in which, for example, a positive weighting factor must be realized. This can be obtained by the manner shown in FIG. 6 by providing a polarity inverting amplifier 211 and by connecting all the signal channels in which a positive weighting factor must be realized in parallel between the output of this polarity inverting amplifier 211 and the "−"-input of the operational amplifier, in the manner as shown in FIG. 6 for the signal channels 207(0) and 207(1).

Figure 7:
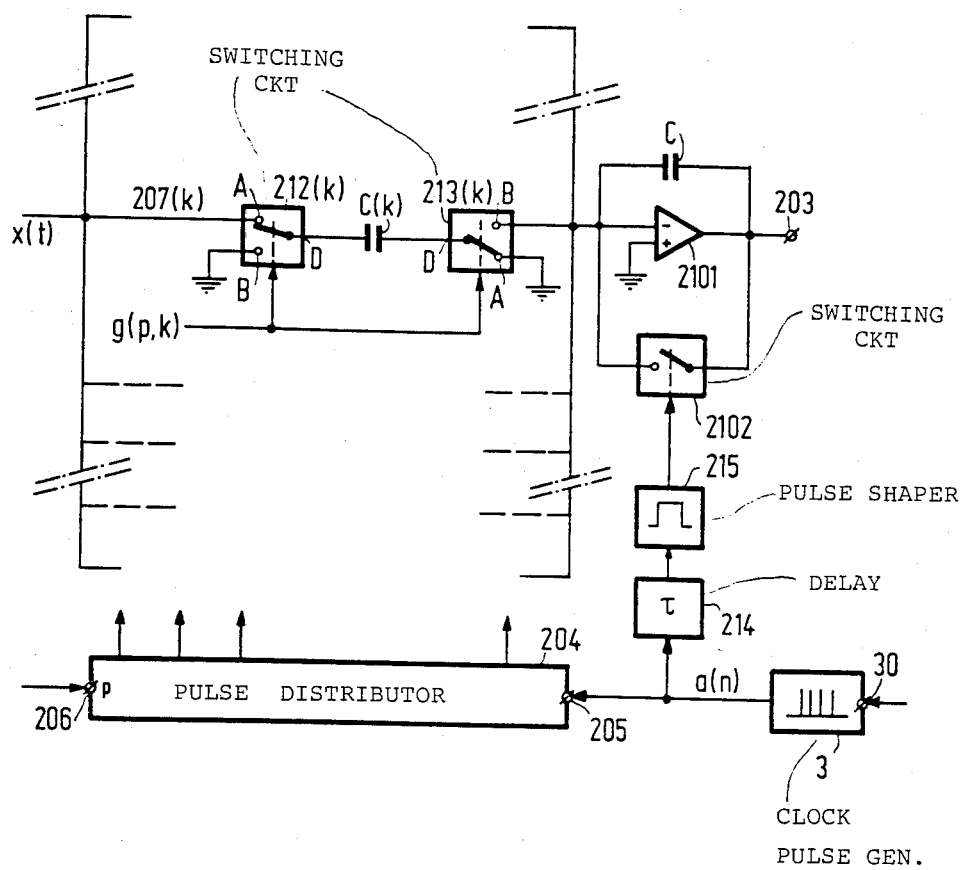

A positive weighting factor for a given signal channel can alternatively be realized by constructing this signal channel in the way as shown in FIG. 7. It differs from each of the signal channels shown in FIG. 6 in that each switching circuit now comprises two double-pole switches 212(k) and 213(k). These switches each have a first pole A, a second pole B and a third pole D. The capacitor C(k) is connected between the third poles D of these two switches. Pole A of switch 212(k) receives reference signal x(t), whilst its pole B is connected to ground potential. Pole A of switch 213(k) is connected to ground potential, whilst pole B is connected to the "−"-input of the operational amplifier 2101. These switches are both simultaneously controlled by the same main control pulses g(p, k) such that the poles D of both switches are either connected to the associated poles A, or to the associated poles B. This circuit operates as follows. When the poles D of both switches are connected to the associated poles A, as is shown in the FIGURE, a quantity of charge +Q(k) is applied in a short period of time to capacitor C(k), such that it is charged to a voltage V(k) which is equal to the value of the reference signal x(t) at that moment and is defined by the relation Q(k)=C(k)·V(k). Thereafter, the poles D of both switches are connected to the associated poles B. By using the operational amplifier, capacitor C(k) is completely discharged thereby and the voltage at the output 203 of this operational amplifier changes by an amount ΔV which is now equal to $$\Delta V = +\frac{C(k)}{C} V(k).$$

As capacitor C(k) is now discharged each time the poles D are connected to the poles B, a switch 2102 must be arranged in known manner in parallel with capacitor C, which switch discharges the capacitor C at equidistant instants. In the embodiment shown here this must happen after the pole D of switch 213(k) is connected to ground via pole A and before the pole D of one of the other switches is connected to the associated pole B, or, which amounts to the same, at an instant located between two consecutive clock pulses a(n). As is shown in FIG. 7 this sequence of clock pulses a(n) is first delayed by a time delay $\tau$ in the delay device 214 and the output pulses thereof are applied to a switch 2102 via a pulse widening circuit 215.

Another embodiment of the multiplying circuit is obtained by connecting the pole A of the switches 213(.) shown in FIG. 7 to the "−"-input of the operational amplifier 2102 and by connecting the pole B to ground potential.

Further embodiments of the multiplying circuit 2 are extensively described in the Reference sub C, to which reference is made for the sake of brevity.

In the embodiments described so far it was assumed that the sequence of clock pulses a(n) and the fundamental signal ñ(t) are mutually shifted through $t_o$. Without effecting the proper operation of the phase-locked loop this phase-shift can be chosen to be equal to zero so that h(0)=0. This implies that the signal channel 207(0) may even be omitted completely. If, in addition, N is assumed to be even, then it holds that:

$$h(0) = 0$$

$$h(N/2) = 0$$

$$|h(m)| = \left|h\left(\frac{N}{2} - m\right)\right| = \left|h\left(\frac{N}{2} + m\right)\right| = |h(N - m)|$$

for $m = 1, 2, 3, \ldots \frac{N}{4}$.

Figure 8:
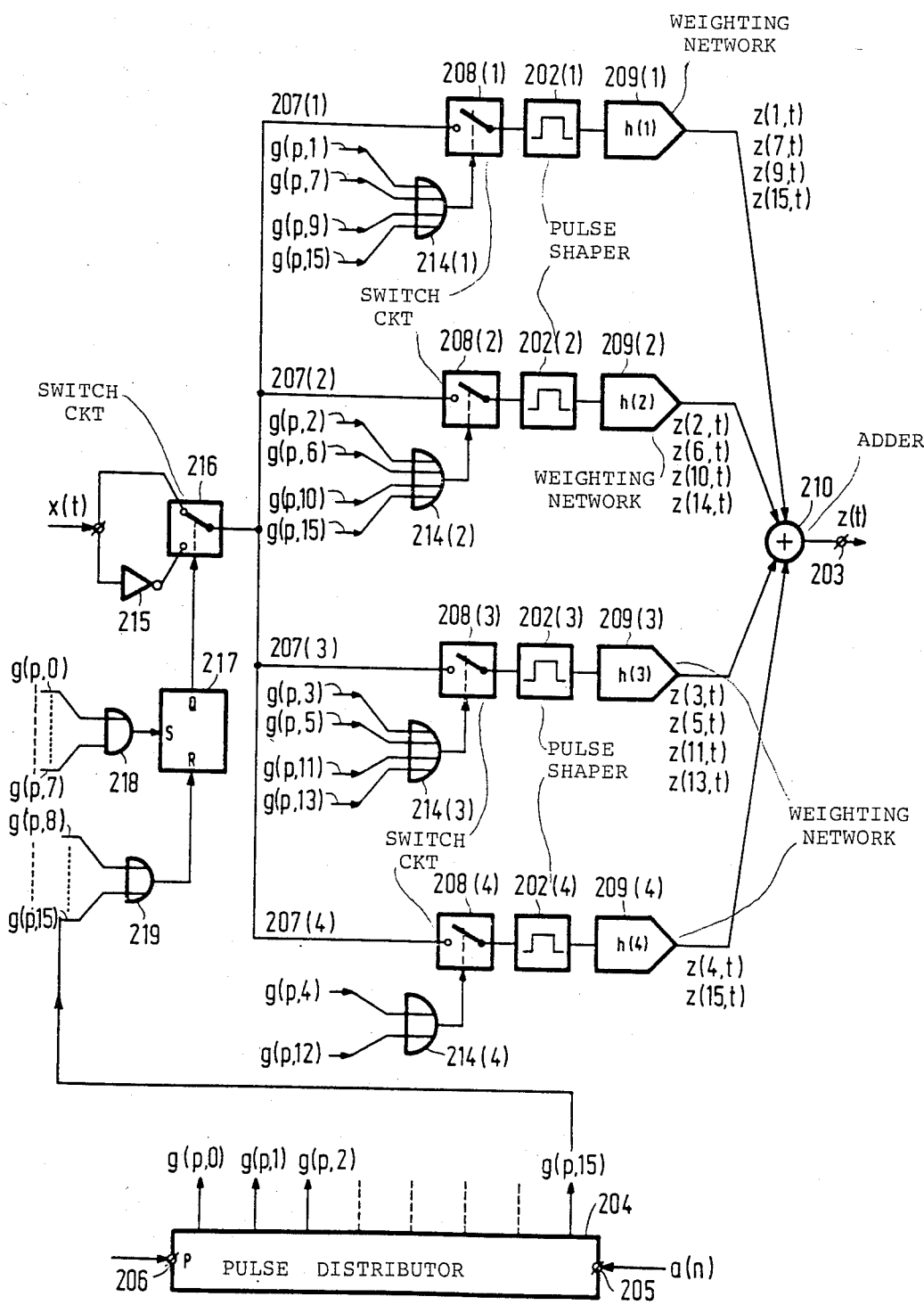

In that case the number of signal channels from which the multiplying circuit must be constructed can be significantly reduced, namely to a number of N/4. A multiplying circuit constructed with this number of signal channels is shown for N=16 in FIG. 8. This multiplying circuit predominantly corresponds to the multiplying circuit shown in FIG. 3, the difference being that therein not one but two or more sequences of main control pulses are now applied to each switch 208(.) via an OR-gate 214(.). The FIGURE shows which sequences of main pulses are involved. As is also the case with the embodiments shown in the foregoing, each signal channel produces a main signal for every sequence of main control pulses applied to the associated switching circuit. Which main signals they are is also shown in the FIGURE and these main signals are added together in the adder arrangement 210. Since the weighting factors h(1), h(2), h(3) and h(4) are assumed to have all the same polarities, but since also weighting factors having polarities opposite thereto are required, the reference signal x(t) is applied to the signal channels either directly or after polarity inversion in a polarity inverting stage 215. To realize this option, a switch 216 is provided whose state is changed after every half period of the comparison signal ŷ(t). To that end this switch 216 is controlled by the output signal of an R-S-flipflop 217, whose S-input receives the sequences of main control pulses g(p, 0), g(p, 1), . . . g(p, 7) via an OR-gate 218. The R-input receives the sequences of main control pulses g(p, 8), g(p, 9), . . . g(p, 15) via an OR-gate 219.

What is claimed is:

1. A phase-locked loop, comprising:
   (a) a reference signal input for receiving an analogue reference signal;
   (b) a clock pulse oscillator having a control input for receiving a control signal and supplying clock pulses a(n) at a rate $f_s$ which is an integral multiple N of a predetermined fundamental frequency $f_o$ of a fundamental signal ñ(t), where n=0, 1, 2, . . .
   (c) a multiplying circuit for multiplying the reference signal by a periodical analogue comparison signal having a frequency which is an integral multiple p of said fundamental frequency, comprising:
      (c1) a pulse distribution circuit receiving said clock pulses from the clock pulse oscillator, comprising a control input for setting the parameter p, and having a number of not more than N distributor outputs and applying the clock pulse having number N to the distributor output having number np modulo N, as a result of which a sequence of main control pulses is produced at each distributor output;
      (c2) a plurality of signal channels each receiving the reference signal and each comprising a cascade arrangement comprising a switching circuit and a weighting network the switching circuit of each cascade arrangement being controlled by at least one of the sequences of main control pulses, the weighting network having a constant weighting factor and the value of the weighting factor of the weighting network in the $k^{th}$ signal channel being related to the value of the fundamental signal at the instant $t_o+kT_s$, where $t_o$ represents a constant and $T_s$ is the reciprocal value of $f_s$, and each signal channel for each sequence of main control pulses applied to the relevant switching circuit producing a main signal;
      (c3) an adder arrangement for adding together all the main signals produced by the different signal channels for generating a multiplying circuit output signal and having a multiplying circuit output;
   (d) a coupling circuit for coupling the multiplying circuit output to the control input of the clock pulse oscillator and which in reponse to the multiplying circuit output signal produces said control signal.

* * * * *